Nov. 29, 1960 L. PENSAK 2,962,639

SEMICONDUCTOR DEVICES AND MOUNTING MEANS THEREFOR

Filed July 25, 1955

INVENTOR.
LOUIS PENSAK
BY J. L. Whittaker
ATTORNEY 2,962,639

SEMICONDUCTOR DEVICES AND MOUNTING MEANS THEREFOR

Louis Pensak, Princeton, N.J., assignor to Radio Corporation of America, a corporation of Delaware Filed July 25, 1955, Ser. No. 524,191
13 Claims. (Cl. 317—234)

This invention relates to improved semiconductor devices and more particularly but not exclusively to improved mounting support and electrical connection means for semiconductive base wafers of transistor devices.

One type of transistor is known as the alloy junction transistor. A typical transistor of this type comprises a base wafer of a semiconductive material such as germanium or silicon and two surface alloyed rectifying electrodes coaxially aligned upon opposite faces of the wafer. A non-rectifying contact is also made to the wafer and is called the base connection because of its electrical function. The base connection may take the form of a relatively large area solder contact between the semiconductor wafer and a strip of metal called a base tab.

In such transistors it is desirable to minimize the thickness of the base wafer in order both to reduce the cost of the transistor by reducing the amount of semiconductive material in it and to provide minimum spacing between the two oppositely disposed rectifying electrodes. Very thin wafers, however, present two principal difficulties. First, they are relatively difficult to handle and are easily broken during processing. Second, a decrease in the thickness of the wafer increases the electrical resistance between the base connection and the rectifying electrodes. For these reasons, previous alloy junction transistors have usually been made with base wafers about .004" to .006" thick.

A further difficulty encountered in the manufacture of transistor devices of the alloy junction type relates to electrode alignment. The positioning of the electrodes upon the base wafer is not critical except in that the two electrodes must be accurately aligned with respect to each other. After one electrode is affixed to one face of the wafer the wafer is inverted and the second electrode is placed upon the opposite face. Although the position of the two electrodes with respect to the edges of the wafer is not critical it is essential that the electrodes be coaxially aligned within close tolerance limits.

The most advantageous method for aligning the electrodes is by measurement with reference to the outer edges of the wafers. Such measurement would obviate the difficulties encountered in accurately locating the first electrode and then measuring with respect to it, as is presently done in conventional manufacturing processes. It is not feasible, however, to align the electrodes by measurement with reference to the edges of the wafers because the dimensions of the wafers cannot readily be accurately controlled to uniform values.

Accordingly, one object of the instant invention is to provide improved transistor devices.

Another object is to provide improved mounting means for the semiconductive base wafers of alloy junction type transistors.

Another object is to facilitate the production of alloy junction type transistors.

The instant invention provides an improved base tab for an alloy junction transistor which effectively overcomes all the previously encountered difficulties, provides an improved transistor device and facilitates its manufacture.

Briefly, a base tab according to the invention comprises a shaped member of relatively thin metal having an accurately located recess, or depression in one portion thereof and an aperture through the member terminating within the depression. The depression serves to hold a semiconductive wafer in a fixed position with respect to the outer boundaries of the member, and the aperture provides access to the face of the wafer in contact with the member. The entire tab may be formed by stamping by a single stroke of a single die so that the spacings between the boundary of the tab, the edge of the depression and the aperture may be automatically maintained without difficulty at any desired degree of accuracy.

The tab permits accurate coaxial alignment of electrodes upon a semiconductive wafer held in the recess. Mechanical means may be readily provided to indicate the location of the aperture by reference to the outer edges of the tab and automatically to place the electrodes in accurate coaxial alignment with the aperture. It is far more difficult to align such electrodes in previous processes because the outside dimensions of the semiconductive wafers are variable and cannot be used as alignment reference points.

The invention will be explained in greater detail with reference to the accompanying drawing of which:

Similar reference characters are applied to similar elements throughout the drawing.

Figure 1:
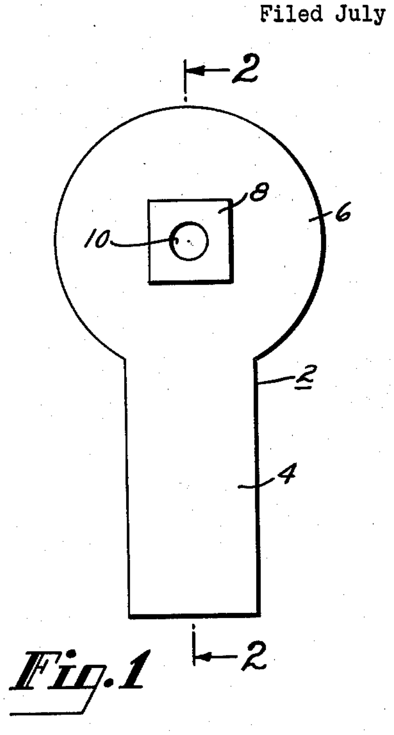
Figure 1 is a greatly enlarged plan view of a base tab according to the invention.
Figure 2:
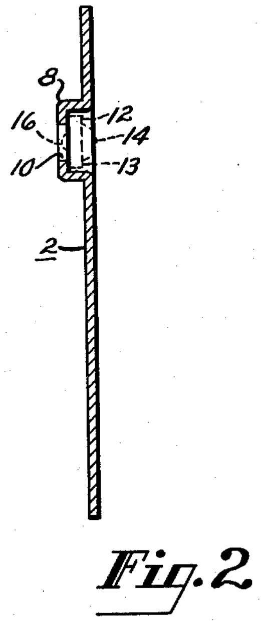
Figure 2 is a cross-sectional, elevational view of the base tab taken along the section lines 2—2 of Figure 1.

A preferred embodiment of the invention is the base tab shown in Figures 1 and 2. This tab comprises a sheet metal keyhole-shaped member 2 preferably of Kovar alloy about .003" thick and 0.310" long. The shank 4 of the tab provides handling means and facilitates the nesting and alignment of the tab with others like it. The eye 6 of the tab is about 0.125" in diameter. A recess, or depression 8 is centrally located in the eye 6 and an aperture 10 extends through the tab at the center of the depression.

The depression may be of any convenient shape such as the square shape shown, about .054" across. It serves to locate a wafer 12 of semiconductive material (shown by dash lines in Figure 2) and to hold it in a fixed location with respect to the outer boundaries of the tab during the transistor manufacturing process. The depression may be of any desired depth but for convenience its depth is preferably about the same or slightly greater than the thickness of the semiconductive wafer. It may be, for example, about .003" thick.

The aperture 10 is made sufficiently large so that a rectifying electrode may be surface alloyed to the wafer upon the surface exposed within the aperture without contacting the tab. For example, if the surface alloyed electrode is about .014" in diameter, the aperture may be about .030" in diameter, leaving a .008" clearance between the edge of the electrode and the walls of the aperture.

A transistor utilizing the base tab just described may be made by first coating the depressed portion 8 of the tab with solder. This may be done by electroplating from a tin-lead solder plating bath, or, alternatively, by placing a small pellet of solder in the depression.

Preferably the solder coating is provided on the metal strip from which the tab is stamped. In this way the corners of the recess may be made sharp and square so that the semiconductor wafer may rest flat on the floor of the recess. If the solder is applied after the tab is formed, it may fill up the corners of the recess and provide fillets therein which may obstruct proper seating of the wafer. Additionally, when the solder is applied to the strip before the tabs are formed, its thickness may be relatively easily controlled so that excess solder is not present.

The quantity of solder upon the tab is relatively critical. There should be enough to provide a firm bond between the tab and the wafer, but not enough to dissolve substantial portions of the wafer during the heating operation, or to bridge across the aperture. It has been found that a coating about .0002" thick is optimum. This quantity of solder is sufficient to form a fillet between the edges of the wafer and the walls of the recess, but is not enough to spread out over the wafer surface within the aperture.

A wafer 12 of n-type semiconductive single crystal germanium is placed in the depression 8. The wafer may be, for example, about .050" square and about .002" thick. The wafer and the base tab are heated together in a non-oxidizing atmosphere such as dry hydrogen or forming gas to a temperature at least as high as the highest temperature attained in subsequent processing steps. In the instant case this temperature is about 550° C. This heating step melts the solder and bonds the wafer to the base tab. It also serves to drive off impurities from the solder that might otherwise contaminate the device during subsequent heating steps.

During soldering, the assembly is preferably held in a horizontal position so that the force of gravity presses the wafer against the floor of the depression and the wafer is allowed to float upon the solder. The wafer assume an equilibrium position while the solder is molten, determined primarily by the surface tension forces of the molten solder, and by the shape and dimensions of the depression or recess. This equilibrium position is relatively important in the practice of the invention because in the manufacture of a transistor device according to the invention the assembly is reheated subsequently to the soldering step. During the subsequent heatings it is important for alignment purposes that the location of the wafer with respect to the edges of the base tab remain fixed.

An electrode pellet (not separately shown) of indium is then affixed to the surface 13 of the wafer opposite from the base tab solder connection. This pellet may, before heating, be a sphere about .015" in diameter. It is dipped in a zinc chloride-ammonium chloride flux and placed upon the surface 13 of the wafer in coaxial alignment with the aperture 10 of the base tab with the aid of a template or other means for locating the center of the aperture by reference to the periphery of the tab.

The accurately reproducible dimensions of the tab facilitate the alignment of the pellet with the aperture. Automatic apparatus or a hand operated fixture may be provided to hold the tab by its outer edges and to place the pellet upon the wafer in accurate alignment with the tab aperture.

The assembly is heated for three minutes at about 250° to 350° C., taking care to maintain the pellet in position, to melt the pellet to cause it to spread out upon the wafer assuming a roughly spherical arcuate form 14 and to become affixed thereto. The assembly is then inverted and a second pellet of indium is placed upon the wafer surface within the aperture 10. The second pellet may be a sphere about .010" in diameter and is fluxed and affixed to the wafer in the same manner as the first pellet forming a rounded electrode 16. Surface tension forces are adequate to prevent the first pellet from falling off the wafer during the second heating step.

The second pellet may be placed manually within the aperture and aligned by visual reference thereto, or it may be placed by means of an automatic apparatus or hand operated fixture in a manner similar to the first pellet.

The entire unit is then heated, preferably in a non-oxidizing atmosphere, to a temperature of about 550° C. for about five minutes to alloy the pellets into the wafer surfaces thereby to form a pair of spaced rectifying barriers in the wafer, each barrier being associated with one of the electrodes.

The rate of heating, the firing temperature, and the time during which the unit is held at its maximum firing temperature may be determined according to known principles to control the alloy process. In particular, the maximum temperature to which the unit is subjected is relatively important in determining the depth of penetration of the electrodes into the wafer. The depth of penetration is critically important in the manufacture of transistor devices because the p-n rectifying barriers are formed at or closely adjacent to the maximum depth of penetration of the electrodes, and the spacing between the two rectifying barriers vitally affects the performance of the completed transistor.

All the heating steps after the wafer is soldered in the tab may be carried out in an ordinary air atmosphere. It is preferred, however, to utilize a non-oxidizing atmosphere such as dry hydrogen or forming gas for the final, high temperature alloying step. If this heating is done in an oxidizing atmosphere, a refractory film tends to form on the indium electrodes 14 and 16 which may impede the subsequent attaching of leads to the electrodes.

After the unit is cooled the device may be conventionally etched, mounted and potted. A typical etching step comprises electrolyzing the unit for a few seconds in a 50% sodium or potassium hydroxide solution and subsequently rinsing the unit thoroughly in distilled water. Electrical leads are attached to the surface alloyed electrodes 14 and 16 respectively, by any known means such as by soldering with Wood's metal or a similar low melting point solder. The base tab serves the dual purpose of a physical mounting support for the transistor unit and an electrical base connection to the wafer.

One important advantage afforded by the base taps of the instant invention is the added facility of aligning the electrodes with respect to each other. The desirability of such alignment is well recognized since misalignment adversely affects the electrical characteristics of transistor devices. When dealing with devices having parts as small as the electrodes of the instant transistors which are apt also to vary somewhat in shape due to the melting processes utilized, alignment presents difficulties of a relatively high order.

The problem is further complicated by the necessary preparatory treatment of the semiconductor wafers. These wafers are conventionally made by slicing a relatively large ingot of semiconductor material into sections about 15 to 20 thousandths of an inch thick. The sections are lapped down to a thickness of about .007" to .008". They are then diced to form wafers of a desired size. The wafers are etched in a hydrochloric acid-nitric acid bath to reduce their thickness to a critical dimension such as .002"±.0001".

In this etching step the critical controlled dimension is the thickness and it is extremely difficult simultaneously to maintain the other dimensions of the wafer within the close limits required for alignment reference purposes.

Thus, it has not previously been possible coaxially to align two oppositely disposed electrodes by reference to an external dimension of the transistor unit. Previous processes generally involve relatively difficult techniques for aligning one electrode by reference to the other electrode or involve the maintenance of completely separate alignment means by which to apply the two electrodes simultaneously. Further problems and complications stem from this latter procedure, particularly with respect to the initial affixing of the electrodes to the wafers while the electrodes are held by the alignment means.

The foregoing difficulties are overcome by a base tab according to the invention which includes alignment reference means integrally combined with the structure of the tab so that the electrodes may be aligned with each other by reference to the outer dimensions of the tab. These dimensions may easily be maintained within relatively close tolerance limits, thus minimizing alignment difficulties.

Neither the shape nor the precise location of the depression which holds the semiconductive wafer is critical in a base tab according to the invention except for identity between successive tabs of a group. The depression preferably has a flat floor which substantially corresponds in size and shape with the semiconductive wafer to be placed in it. Thus, when the wafer is soldered into place it assumes an equilibrium position determined by the walls of the depression and by the surface tension of the molten solder. The location of the depression with respect to the aperture is critical only in that the entire aperture must be within the floor of the depression and must be completely covered by the surface of the wafer when the wafer is in place. Preferably, of course, the aperture is centered within the depression.

When the base tabs are made by stamping, the critical accuracy required, which relates to correspondence between successive tabs is automatically provided by stamping in a single operation so that the outer edges of the tab, the depression and the aperture are all formed by a single die. The spacing, therefore, between the aperture and the edges of the tab can be held to tolerances represented by the wear of the die. Such tolerances are fully adequate for alignment purposes and, since the base tabs are relatively thin and may be made of metals such as Kovar or iron-nickel alloys which are relatively soft as compared to hardened steel dies, the wear encountered in stamping is practically insignificant.

Further advantages of a base tab according to the instant invention include provision for the use of a semiconductive base wafer of a minimum size consistent with the electrical requirements of the device. Reducing the size of the base wafer is an important advantage because the presently known semiconductive materials suitable for transistor use are relatively expensive. The base tab also serves as a physical support for the base wafer during the entire process and remains as a permanent part of the unit. It may be directly welded to the mounting stem.

The tab provides ease of handling during processing since it is of relatively large size and may be made of relatively strong and rugged sheet metal. The recess stiffens the tab and makes it rigid so that strains are not transmitted to the semiconductive wafer. Such a tab is much easier to handle than the semiconductive wafers themselves which are relatively brittle and generally substantially smaller than the tabs.

The electrical properties of transistor devices are also improved by the base tab of the invention because it provides a relatively large area contact to the base wafer in close proximity to one of the electrodes. This arrangement minimizes the base resistance of the transistor because it reduces the effective length of the electric current path through the semiconductive wafer from the base contact to the electrodes.

Figure 3:
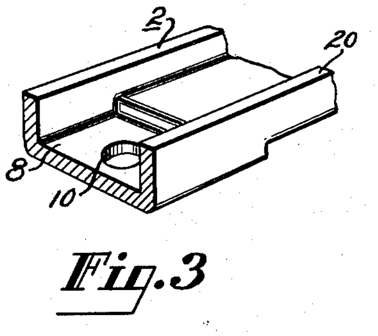
Figure 3 is a perspective view of a base tab representing another embodiment of the instant invention.

A second embodiment of the instant invention is the base tab shown in Figure 3. This tab comprises a channel member 20 having a recess 8 in its floor and an aperture 10 centrally located in the floor of the recess. This base tab incorporates the principles heretofore explained and may be regarded as an abbreviated version of the base tab shown in Figure 1 wherein the sides of the eye of the tab are folded upwards to form a channel around the recess. Such a tab may be made substantially smaller in its crosswise dimension than the base tab shown in Figure 1 and is, therefore, preferred for use in devices whose overall size must be minimized.

Figure 4:
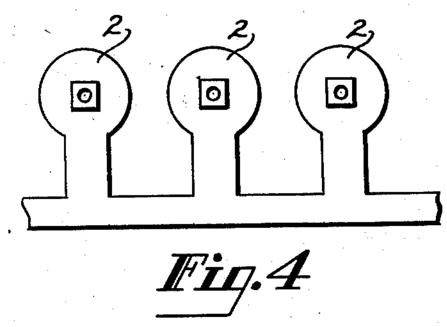
Figures 4 and 5 are plan views of strips of punched sheet metal showing two different arrangements for continuous production of base tabs according to the invention.
Figure 5:
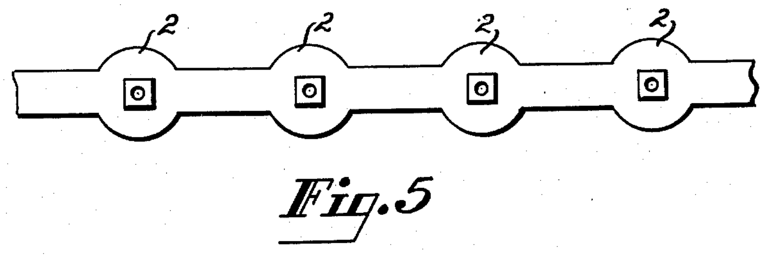

Figures 4 and 5 show two illustrative forms in which base tabs according to the invention may be stamped in continuous strips. In Figure 4 the tabs are shown as punched out in a transverse orientation across a relatively wide strip of metal. They are joined together by connecting strips between their shank portions. They may be processed in this arrangement and cut apart only after each one has been fitted with a completed transistor and is ready for mounting. The placement of the connecting strips at the shank portions of the tabs minimizes any physical strain that may be induced in the transistor by the cutting away of the strips from the base tabs proper.

The arrangement shown in Figure 5 in which consecutive tabs are cut in longitudinal alignment with the metal strip from which they are stamped, provides the advantage of greater rigidity for the individual tabs during processing. Trimming of the connecting strips, however, is more apt to transmit strains to the completed transistors than in the arrangement shown in Figure 4.

The practice of the invention is not limited to the manufacture of devices of the specific type described herein but extends also to other semiconductive devices in which electrical contact must be made to opposite sides of relatively thin semiconductive wafers. While base tabs according to the invention are especially adapted for use in alloy junction type transistors, they are also advantageous for point and area contact transistors of the so-called coaxial type.

It should be noted that the specific transistor manufacturing methods and the materials used as heretofore described are not essential features of the instant invention but may be varied according to known principles. The base tabs, for example, are equally advantageous regardless of the identity of the semiconductive wafer, be it germanium, silicon or any other material.

There have thus been described improved base tabs and transistor devices incorporating them. The tabs serve to reduce the cost of the materials in transistors, to facilitate transistor manufacture, and also to improve the electrical properties of transistors.

What is claimed is:

1. A semiconductor device base tab comprising a unitary, keyhole-shaped sheet metal member having an eye portion and a shank portion, and having an aperture through its thickness dimension within said eye portion and a recess within said eye portion and surrounding said aperture, said recess having a substantially flat floor and being adapted to hold a flat semiconductive wafer in a fixed self-aligned equilibrium position relative to the outer edges of said member.

2. A semiconductor device base tab comprising a unitary, keyhole-shaped sheet metal member having an eye portion and a shank portion, and having an aperture through its thickness dimension within said eye portion and a recess within said eye portion and surrounding said aperture, said recess having a substantially flat floor and being adapted to hold a flat semiconductive wafer in a fixed self-aligned equilibrium position relative to the outer edges of said member, at least a portion of said member including said recess having a solder coating about .0002" thick.

3. A semiconductor device base tab assembly comprising a plurality of individual base tabs connected together to form an integral strip, each of said individual base tabs comprising a unitary, shaped sheet metal member having an aperture through its thickness dimension and a recess surrounding said aperture, said recess having a substantially flat floor and being adapted to hold a flat semiconductive wafer in a fixed self-aligned equilibrium position relative to the outer edges of said base tab, each of the apertures of said base tabs being similarly positioned with respect to the peripheries of said base tabs, said strip being severable so that said individual base tabs may be cut apart one from another.

4. Method of making semiconductor devices comprising the steps of soldering semiconductive wafers in longitudinally spaced recessed portions of a sheet metal strip, affixing rectifying electrodes in coaxial alignment upon opposite sides of said wafers after they are soldered in said recessed portions, said alignment being accomplished by measurement with respect to the outer edges of said strip, and cutting said strip transversely to its length to separate said recessed portions one from another.

5. A transistor device comprising a wafer of a semiconductive material having two rectifying electrodes disposed upon opposite surfaces thereof and a base tab soldered to said wafer, said base tab comprising a unitary, shaped sheet metal member having an aperture through its thickness dimension and a recessed portion surrounding said aperture, said wafer being disposed within said recessed portion and one of said electrodes being disposed within said aperture in coaxial alignment with respect to the other of said rectifying electrodes.

6. A transistor device comprising a wafer of a semiconductive material having two rectifying electrodes disposed upon opposite surfaces thereof and a base tab soldered to said wafer; said base tab comprising a unitary, keyhole-shaped sheet metal member having an eye portion and a shank portion, an aperture through its thickness dimension within said eye portion and a recess within said eye portion surrounding said aperture; said wafer being disposed within said recess and one of said electrodes being disposed within said aperture in coaxial alignment with respect to the other of said rectifying electrodes.

7. A method for positioning a semiconductive wafer in a recessed portion of a metal strip comprising floating said semiconductive wafer on a molten solder layer contained in said recess to assume an equilibrium position of alignment with respect to an edge of said strip.

8. A method of making a semiconductor device comprising placing a semiconductive wafer in a recessed solder-precoated portion of a sheet metal strip having an aperture within said recess, melting said solder to thereby fix said wafer in an equilibrium position with respect to an edge of said strip and affixing a rectifying electrode in said aperture on a face of said wafer in a predetermined position by measurement with respect to an edge of said strip.

9. A method of making a semiconductor device comprising floating a semiconductive wafer on a molten layer of solder contained in a recessed portion of a sheet metal strip, allowing said wafer to assume an equilibrium position with respect to an edge of said strip, freezing said solder and affixing rectifying electrodes in coaxial alignment with respect to one another upon opposite sides of said wafer, said alignment being accomplished by measurement with respect to an edge of said strip.

10. A strip assembly of semiconductor devices comprising a plurality of individual base tabs connected together to form an integral strip, each of said individual base tabs comprising a unitary, shaped sheet metal member having an aperture through its thickness dimension and a recess surrounding said aperture; a wafer of a semiconductive material disposed within said recess and soldered thereto; and at least one rectifying electrode disposed on a surface of said wafer.

11. The assembly of claim 10 wherein said wafer has two rectifying electrodes disposed upon opposite surfaces thereof in axial alignment one with the other.

12. The method of making a plurality of semiconductor devices comprising: providing a base tab strip assembly consisting of a plurality of individual base tabs connected together to form an integral strip, each of said base tabs comprising a unitary, shaped sheet metal member having an aperture through its thickness dimension and a recess surrounding said aperture; and, with respect to each of said base tabs, repeating in sequence the following steps: soldering a semiconductor wafer in said recess and affixing at least one rectifying electrode on a face of said wafer.

13. The method of claim 12 wherein two rectifying electrodes are affixed in coaxial alignment with respect to one another on opposite faces of said wafer.

References Cited in the file of this patent

UNITED STATES PATENTS

| | | |
|---|---|---|
| 2,137,831 | Brunke | Nov. 22, 1938 |
| 2,221,773 | Berman | Nov. 19, 1940 |
| 2,345,038 | De Lange et al. | Mar. 28, 1944 |
| 2,665,399 | Lingel | Jan. 5, 1954 |
| 2,685,728 | Ohl | Aug. 10, 1954 |
| 2,744,218 | Burton et al. | May 1, 1956 |
| 2,796,563 | Ebers et al. | June 18, 1957 |
| 2,854,610 | Waters et al. | Sept. 30, 1958 |

FOREIGN PATENTS

| | | |
|---|---|---|
| 892,641 | Germany | Oct. 8, 1953 |
| 1,103,565 | France | May 25, 1955 |